(12) United States Patent
Usoskin

(10) Patent No.: US 7,394,628 B2
(45) Date of Patent: Jul. 1, 2008

(54) METHOD AND APPARATUS FOR REGULATION OF ELECTRICAL POWER

(75) Inventor: Alexander Usoskin, Hösbach (DE)

(73) Assignee: European High Temperature Superconductors, Alzenau (DE)

( * ) Notice: Subject to any disclaimer, the term of this patent is extended or adjusted under 35 U.S.C. 154(b) by 0 days.

(21) Appl. No.: 11/622,309

(22) Filed: Jan. 11, 2007

(65) Prior Publication Data
US 2007/0184985 A1    Aug. 9, 2007

(30) Foreign Application Priority Data
Jan. 13, 2006  (EP) ................................. 06000722

(51) Int. Cl.
*H02H 9/00*    (2006.01)
(52) U.S. Cl. .......................... 361/19; 335/216; 62/259.2; 505/850
(58) Field of Classification Search ................... 361/19; 335/216; 62/259.2; 505/850
See application file for complete search history.

(56) References Cited

U.S. PATENT DOCUMENTS 5,379,020 A    1/1995  Meier et al. .................. 505/211

6,629,426 B2    10/2003  Paul et al. ................... 62/259.2

FOREIGN PATENT DOCUMENTS

| DE | 44 18 050 A1 | 1/1995 |
|---|---|---|
| DE | 197 50 760 A1 | 5/1999 |
| DE | 100 32 368 A1 | 1/2002 |
| EP | 0 502 644 A1 | 9/1992 |
| EP | 1 217 708 A1 | 6/2002 |
| JP | 1 185130 A | 7/1989 |

*Primary Examiner*—Ramon M Barrera
(74) *Attorney, Agent, or Firm*—Baker Botts L.L.P.

(57) ABSTRACT

An apparatus for regulation of electrical power has a superconducting member exhibiting a capability of quenching at the electrical current exceeding a threshold value, a metallic member coupled to the superconducting member, a thermally insulated and tight internal container filled with a portion of a liquid fraction of a cooling agent and a portion of a gas fraction of the cooling agent. The internal container being capable to provide a cooling of the superconducting member and the metallic member by their direct contact with the liquid fraction of the cooling agent in and to provide a mass exchange of the cooling agent between the internal container and an external container. The mass exchange of the cooling agent has a mass flow controller for the cooling agent which is output from the inner container; a controller of an instantaneous pressure in the internal container, and a delay circuit providing a pre-determined time-delay for mass flow controller operation.

20 Claims, 6 Drawing Sheets

METHOD AND APPARATUS FOR REGULATION OF ELECTRICAL POWER

RELATED APPLICATION

This application claims priority from European Patent Application No. 06 000 722.6, which was filed on Jan. 13, 2006, and is incorporated herein by reference in its entirety.

1. Technical Field

The invention relates to methods and apparatuses for regulation of the electrical power.

2. Background

A method and apparatus for regulating electric power, also referred to as current limiters or fault current limiters, are known for example from U.S. Pat. No. 5,379,020. The method comprises transporting an electrical current through a superconducting member exhibiting a capability of quenching at the electrical current exceeding a threshold value, transporting an additional electrical current through a metallic member coupled to the superconducting member, filling a thermally insulated and tight internal container with a portion of a liquid fraction of a cooling agent, liquid nitrogen, and a portion of a gas fraction (nitrogen) of the cooling agent, cooling the superconducting member and the metallic member by their direct contact with the liquid fraction of the cooling agent in the internal container and providing a mass exchange of the cooling agent between the internal container and an external container, in order to refill the internal container up to operation level.

An apparatus for realizing this method comprises:
- a superconducting member exhibiting a capability of quenching at an electrical current exceeding a threshold value,
- a metallic member coupled to the superconducting member,
- a thermally insulated and tight internal container filled with a portion of a liquid fraction of a cooling agent and a portion of a gas fraction of the cooling agent,
- the internal container being capable of providing a cooling of the superconducting member and the metallic member by their direct contact with the liquid fraction of the cooling agent and
- means for providing a mass exchange of the cooling agent between the internal container and an external container Such method and apparatus can be used to regulate electrical power, in particular to regulate the current in an external electrical circuit to which the device has been has been coupled. The external circuit may be protected against overcurrents. However, these types of current limiting devices suffer from the disadvantages that the reaction time of the apparatus is relatively long and is insufficient for some applications. Furthermore, local overloads (so called "hot spots") may occur in the superconducting member at current overloads. These hot spots may limit a lifetime of the superconductor and, in extreme cases, can lead to failure of the superconductor member and the apparatus.

SUMMARY

It is an object of the present invention to provide a method and an apparatus for regulation of electrical power which exhibits a short reaction time. A further object of the present invention is to increase the lifetime of the apparatus. A further object of the invention is to provide apparatus which can be cost-efficiently produced.

According to an embodiment, a method for regulation of electrical power may comprise:

- transporting an electrical current through a superconducting member exhibiting a capability of quenching at the electrical current exceeding a threshold value;
- transporting an additional electrical current through a metallic member coupled to the superconducting member;
- filling of a thermally insulated and enclosed internal container with a portion of a liquid fraction of a cooling agent and a portion of a gas fraction of the cooling agent;
- cooling of the superconducting member and the metallic member by their direct contact with the liquid fraction of the cooling agent in the internal container, and
- providing a mass exchange of the cooling agent between the internal container and an external container. The exchange of the cooling agent can be controlled as a function of both a mass flow of the cooling agent which is output from the internal container, and an instantaneous pressure in the internal container and with an interruption of a predetermined duration.

According to another embodiment, an apparatus for regulation of electrical power may comprise a superconducting member exhibiting a capability of quenching at the electrical current exceeding a threshold value, a metallic member coupled to the superconducting member, a thermally insulated and tight internal container filled with a portion of a liquid fraction of a cooling agent and a portion of a gas fraction of the cooling agent, the internal container being capable to provide a cooling of the superconducting member and the metallic member by their direct contact with the liquid fraction of the cooling agent, and means for providing a mass exchange of the cooling agent between the internal container and an external container, wherein the means for the mass exchange of the cooling agent comprise a mass flow controller for the cooling agent which is output from the inner container; a controller of an instantaneous pressure in the internal container, and a delay circuit providing a pre-determined time-delay for mass flow controller operation.

BRIEF DESCRIPTION OF THE DRAWINGS

Methods and apparatus for regulation of the electrical power in accordance with the present invention will now be described, by way of example, with reference to the following accompanying figures.

DETAILED DESCRIPTION

Figure 1:
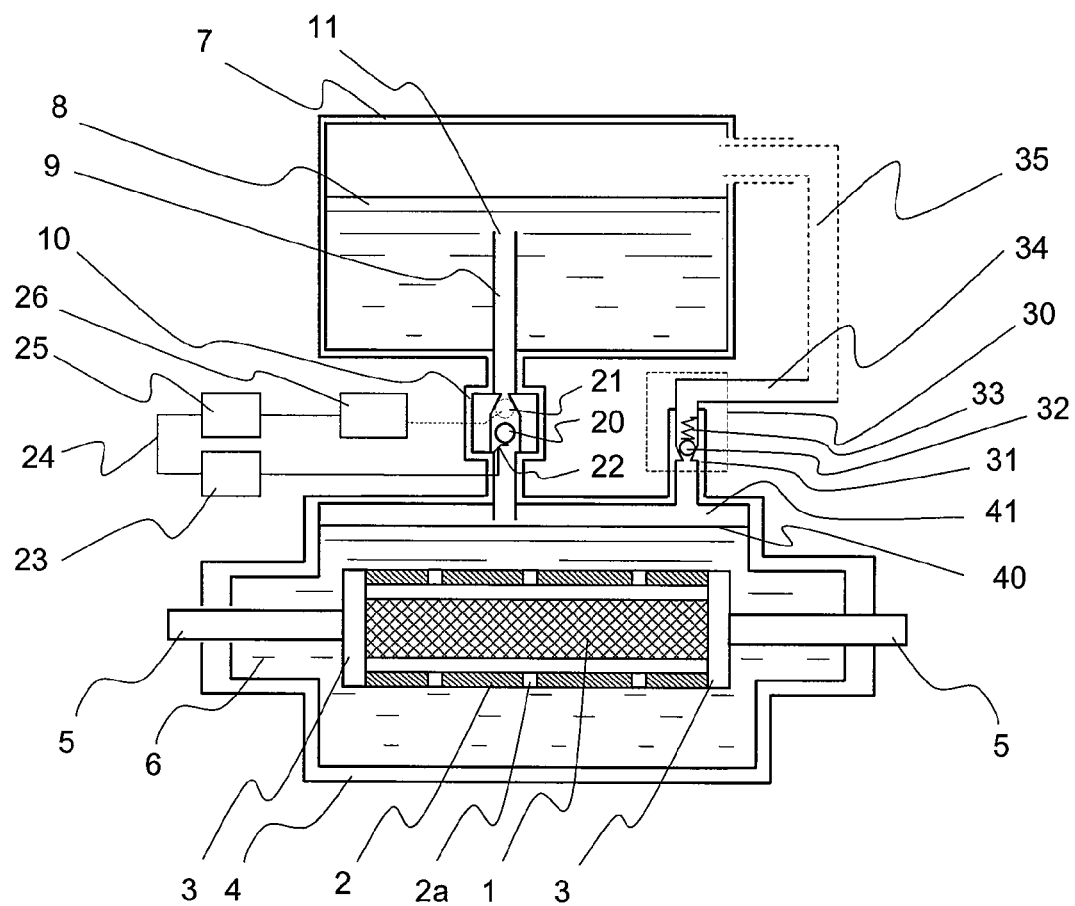
FIG. 1 A schematic view of a first embodiment of the device.

During normal operation, the superconductor is in the superconducting, i.e. a low resistance state. When a threshold current is exceeded, the superconductor rapidly enters a highly resistive state or quenches, thus regulating the current. The method according to an embodiment, controls the quenching of the superconductor and consequently regulates the electric power by controlling the cooling power delivered by the cooling agent to the superconductor member during an overcurrent or fault current condition. In particular, the cooling power of the cooling agent is varied with time, in particular after the start of an overcurrent or fault condition.

According to an embodiment, the exchange of the cooling agent between the external container and internal container in which the superconductor member is positioned is controlled in order to control the quenching characteristics of the superconductor member.

According to an embodiment, the exchange of the cooling agent is controlled by controlling the following parameters after the initial stages of the quenching of the superconductor. The initial quenching stage may occur at localized regions or hot spots. According to an embodiment, the following parameters are controlled with a desired time sequence in order to achieve the desired quenching characteristics of the superconductor and, therefore, control the regulation of the electric power or current in an external circuit to which apparatus used to perform the method is coupled: the mass flow of the cooling agent which is output from the internal container, and an instantaneous pressure in the internal container with an interruption of a predetermined duration. In this context, an interruption of a predetermined duration refers to a time delay between the control of the mass flow of the cooling agent and the instantaneous pressure in the internal container and, in particular, between the initiation of the control of the mass flow of the cooling agent and the instantaneous pressure in the internal container.

For example, according to an embodiment, when the superconducting member starts to enter the highly resistive state, localized isolated regions of the superconductor may enter the highly resistive state, i.e. quench, first. This results in boiling of the liquid cooling agent. This increase in pressure can be controlled by closing the internal container to reduce or prevent the mass flow of cooling agent from the external container to the internal container. The closing of the internal container leads to an increase in pressure within the internal container and an increase in the boiling temperature of the cooling agent. The cooling power delivered by the cooling agent to the superconducting member is reduced which leads to a fast quench of the entire superconductor.

This method has the advantage that the reaction time of the regulation of the electrical power in the external circuit is reduced. Furthermore, since the entire superconductor is encouraged to quench rapidly, this suppresses the influence of localized hot spots which leads to an increase in the lifetime of the superconducting ember and the electrical device.

In an embodiment, the mass exchange is enabled when the instantaneous pressure in the internal container exceeds the pressure in the external container by a pre-determined value. Cooling agent is allowed to enter the internal container from the external container to increase the cooling power.

In a further embodiment, the mass exchange is substantially reduced after the mass flow that is output from the internal container exceeds a pre-determined level. This regulates the temperature and cooling power within the internal container.

In a further embodiment, the mass exchange is enabled after the predetermined time delay after the instantaneous pressure in the internal container reaches higher values compared to the pressure in the external container. This enables a reduction in the cooling power and an increase in the boiling temperature of the cooling agent for a desired time interval.

An apparatus for regulation of electrical power according to an embodiment may comprise:
  a superconducting member exhibiting a capability of quenching at the electrical current exceeding a threshold value,
  a metallic member coupled to the superconducting member,
  a thermally insulated and tight internal container filled with a portion of a liquid fraction of a cooling agent and a portion of a gas fraction of the cooling agent,
  the internal container being capable to providing a cooling of the superconducting member and the metallic member by their direct contact with the liquid fraction of the cooling agent in and
  means for providing a mass exchange of the cooling agent between the internal container and an external container.

According to an embodiment, the means for the mass exchange of the cooling agent may comprise:
  a mass flow controller for the cooling agent which is output from the inner container;
  a controller of an instantaneous pressure in the internal container, and
  a delay circuit providing a pre-determined time-delay for mass flow controller operation.

According to an embodiment, the apparatus for regulating electric power, when in operation, is coupled to an external circuit which is to be regulated. This may be carried out in a number of ways which a known In the art.

According to an embodiment, the mass flow controller enables the mass flow of the cooling agent from the external container to the internal container in which at least the superconducting member is positioned to be controlled so as to control the cooling power of the cooling agent in the internal container and consequently to control the quenching of the superconducting member and regulate the electrical power or current in the external circuit to which the apparatus is coupled.

According to an embodiment, the controller of the instantaneous pressure enables the pressure within the internal container to be regulated. The controller may be closed, for example after an overcurrent condition is detected as an increase in pressure within the internal container, in order to increase the pressure within the container and reduce the cooling power. This encourages the rapid quenching of the entire superconductor member and increases the reaction time of the apparatus. If, for example, the pressure exceeds a pre-determined value the controller which may comprise a valve for example can be opened and the pressure in the internal container reduced. The boiling temperature of the cooling agent can, therefore, be controlled as desired.

According to an embodiment, the delay circuit may provide a predetermined delay between the closing of the valve which controls the instantaneous pressure of the internal container and the opening of the mass flow controller which allows the input of the cooling agent from the external container to the internal container and a reduction in the boiling temperature of the cooling agent within the internal container. The cooling power of the cooling agent within the internal container is, therefore, improved. The delay circuit, therefore, allows the cooling power of the cooling agent in the internal container to be reduced for a predetermined time interval.

According to an embodiment, the means for controlling the mass exchange of the cooling agent and the internal container, therefore, provide a means by which the quenching of the superconductor member can be controlled and, consequently, provides a means by which the regulation or limiting of the current in an external circuit to which the apparatus is attached may be controlled.

In an embodiment, the mass flow controller comprises a transient member that is capable of transporting the cooling agent and which provides an increased differential pressure between the internal container and the external container after each event of increased mass flow.

According to an embodiment, the transient member may be provided as a nozzle. Alternatively, the transient member may be provided as an externally controllable valve.

According to an embodiment, the controller of the instantaneous pressure may comprise a further valve which is a normally closed valve.

According to an embodiment, the mass flow controller may comprise two or more transient members which may be independently controlled to provide a finer control of the mass flow of e cooling agent from the external container to the internal container.

According to an embodiment, the delay circuit may provide the opening of the externally controlled valve. A triggering pulse may be provided by the time delay circuit after a predetermined time r time interval which is delivered to the transient member so that the cooling agent is delivered into the internal container. According to an embodiment, a triggering pulse may be sent to an actuator so that a valve opens and the mass flow of cooling agent is enabled.

In an embodiment, the metallic member is at least partly provided by at least one metallic wall of the internal container.

In a further embodiment, the metallic member is coupled to the superconducting member by electrical joints or through a common part of magnetic flux. The apparatus and method are, therefore, suitable for use with both inductive and resistive electric power regulators.

According to an embodiment, the superconducting member may comprise a superconducting material which is defined as material which below a critical temperature, a critical magnetic field and a critical current exhibits superconductivity. Examples of superconductors are $Nb_3Sn$ and NdTi which are commonly referred to low temperature superconductors and $ReBa_2Cu_3O_{7-x}$, where Re is one or more rare earth elements such as Y, $Bi_2Sr_2CaCu_2O_x$ and $Bi(Pb)_2Sr_2Ca_2Cu_3O_x$ which are commonly referred to as high temperature superconductors the cooling agent is chosen depending on the critical temperature of the superconducting member. For superconducting members comprising $ReBa_2Cu_3O_{7-x}$, $Bi_2Sr_2CaCu_2O_x$ and $Bi(Pb)_2Sr_2Ca_2Cu_3O_{10}$ liquid nitrogen may be conveniently used as the cooling agent.

According to an embodiment, the superconducting member may be provided in a number of forms, for example a cylinder of a superconductor, a coating of a superconductor on a substrate, which may be non-electrically conducting such as a ceramic, or in the form of a coating or film on a flexible metallic tape substrate. One to two sides of the tape may be coated with the superconducting phase. According to an embodiment, the superconductor member may comprise biaxially textured $ReBa_2Cu_3O_{7-x}$ tape.

FIG. 1 depicts a schematic view of the first embodiment of the apparatus. The apparatus comprises:
a superconducting member 1 exhibiting a capability of quenching at an electrical current exceeding a threshold value,
a metallic member 2 coupled to the superconducting member by jointing discs 3,
a thermally insulated and tight internal container 4 filled with a cooling agent of which a portion of a liquid fraction 6 of a cooling agent and a portion of a gas fraction 31 of the cooling agent,
the internal container 4 being capable of providing a cooling of the superconducting member 1 and the metallic member 2 by their direct contact with the liquid fraction 6 of the cooling agent in the apparatus of FIG. 1, the superconducting member is positioned within the inner cavity of the metallic member. A number of openings 2a provided in the metallic member which allow passage of the liquid cooling agent 6 into the cavity and enable direct contact between the liquid cooling agent 6 and the superconducting member 1 and means 9, 10, 20-26 and 30, 34, 35 for providing a mass exchange of the cooling agent between the internal container 4 and an external container 7.

These means for the mass exchange, according to an embodiment, comprise
a mass flow controller 9, 10, 20-24, 26 for controlling the cooling agent which is output from the inner container 4,
a controller 30-35 of an instantaneous pressure in the internal container 4, and
a delay circuit 25 providing a pre-determined time-delay for mass flow controller operation.

The mass flow controller comprises a transient member 9, 10, 20-23, 26 that is capable of transporting the cooling agent and provides an increased differential pressure between the internal container 4 and the external container 7 after each event of increased mass flow.

In the present embodiment the transient member is provided as an externally controlled valve, based on a ball 20 moving between position 20 and position 21, and an offset positioner 22.

The controller of the instantaneous pressure comprises a normally closed additional valve 30, where a ball 32 is elastically pressed by a spring 32 to a nozzle 31. The additional valve may also be connected to an upper part of the external container 7, at a position which is above the level of the liquid cooling agent 8.

The delay circuit 25 provides opening of the externally controlled valve 20, 20-22 using a triggering signal produced by the moving ball 20. This pulsed signal is amplified by an amplifier 23, and delivered via connection 24 to the delay circuit 25. Delayed pulse is delivered to an actuator 26 which provides a return of the ball to the position 20.

The apparatus construction also comprises two electrical feedthroughs 5 which deliver electrical current to the superconducting member 1 and the metallic member 2.

A method employed for operation of the apparatus of FIG. 1 comprises:
transporting an electrical current through a superconducting member 1 exhibiting a capability of quenching at the electrical current exceeding a threshold value,
transporting an additional electrical current through a metallic member 2 coupled to the superconducting member 1,
filling of a thermally insulated and tight internal container 4 with a portion of a liquid fraction 6 of a cooling agent and a portion of a gas fraction 31 of the cooling agent,
cooling of the superconducting member 1 and the metallic member 2 by their direct contact with the liquid fraction 6 of the cooling agent in the internal container 4 and
providing a mass exchange of the cooling agent between the internal container 4 and an external container 7.

The exchange of the cooling agent is, according to an embodiment, controlled as a function of at least three following parameters:
a mass flow of the cooling agent which is output from the inner container 4,
an instantaneous pressure in the internal container 4,
a pre-determined time-delay.

The transporting of the current through the superconducting member 1 and transporting of the additional current trough the metallic member 2 is provided by sharing the current delivered by electrical feedthroughs 5 at the jointing discs 3.

The filling of the internal container 4 follows through the external container 7 which is filled with the liquid cooling agent, namely liquid nitrogen in the considered example. When level of the liquid cooling agent is sufficiently high, the agent starts to fill the internal container 4 through the pipe 9 and open valve 10. Filling of the internal container 4 lasts until the level 40 of liquid cooling agent is high enough, so that only a small rest volume 41, typically, of several cubic centimetres, is filled with a gas fraction 31 of the cooling agent.

The cooling of the superconducting member 1 occurs though a direct contact with the liquid fraction 6 of the cooling agent in the internal container 4. This is provided using a number of small through-openings 2a in the outer walls of the metallic member 2 which allow the liquid cooling agent to enter to the interior cavity of the metallic member 2 where the superconducting member 1 is located. Direct surface to surface cooling of the superconducting member 1 is provided.

At the initial stage, at a nominal current in the superconducting member 1 the mass flow of the cooling agent is small, so that the externally controlled valve 10 is in the open state 20. Instantaneous pressure in the internal container 4 is practically equal to the pressure in the external container 7. Therefore, the normally closed additional valve 30 keeps closed.

When the electrical current in the superconducting member 1 exceeds a threshold value the superconducting member 1 starts to quench and enters a highly resistive state. During the first moments, the quenching occurs at a number of local spots. As a result of the generation of Joule's heat in the superconducting member 1 and in the metallic member 2 boiling of the liquid cooling agent intensifies, and the mass flow of the cooling agent which is output from the internal container 4 rapidly increases. This causes a closing of the externally controlled valve 10. As the volume 41 of the internal container 4 occupied by the gas portion of the cooling phase is rather small, the pressure in the internal container 4 rapidly grows.

The upper limit of this pressure is predetermined by the controller 30-35 of an instantaneous pressure. When the pressure exceeds the predetermined level the normally closed additional valve 30 opens, so that the pressure drops down. As a result the instantaneous pressure in the container slightly oscillates. After a pre-determined time-delay a triggering pulse, initially triggered by the ball 20 and the offset positioner 22, is delivered to the actuator 26 which provides a return of the ball to the initial position 20. Externally controlled valve opens and the pressure in the container 4 equalizes with the pressure in the external container 7 during a certain time period.

Figure 2:
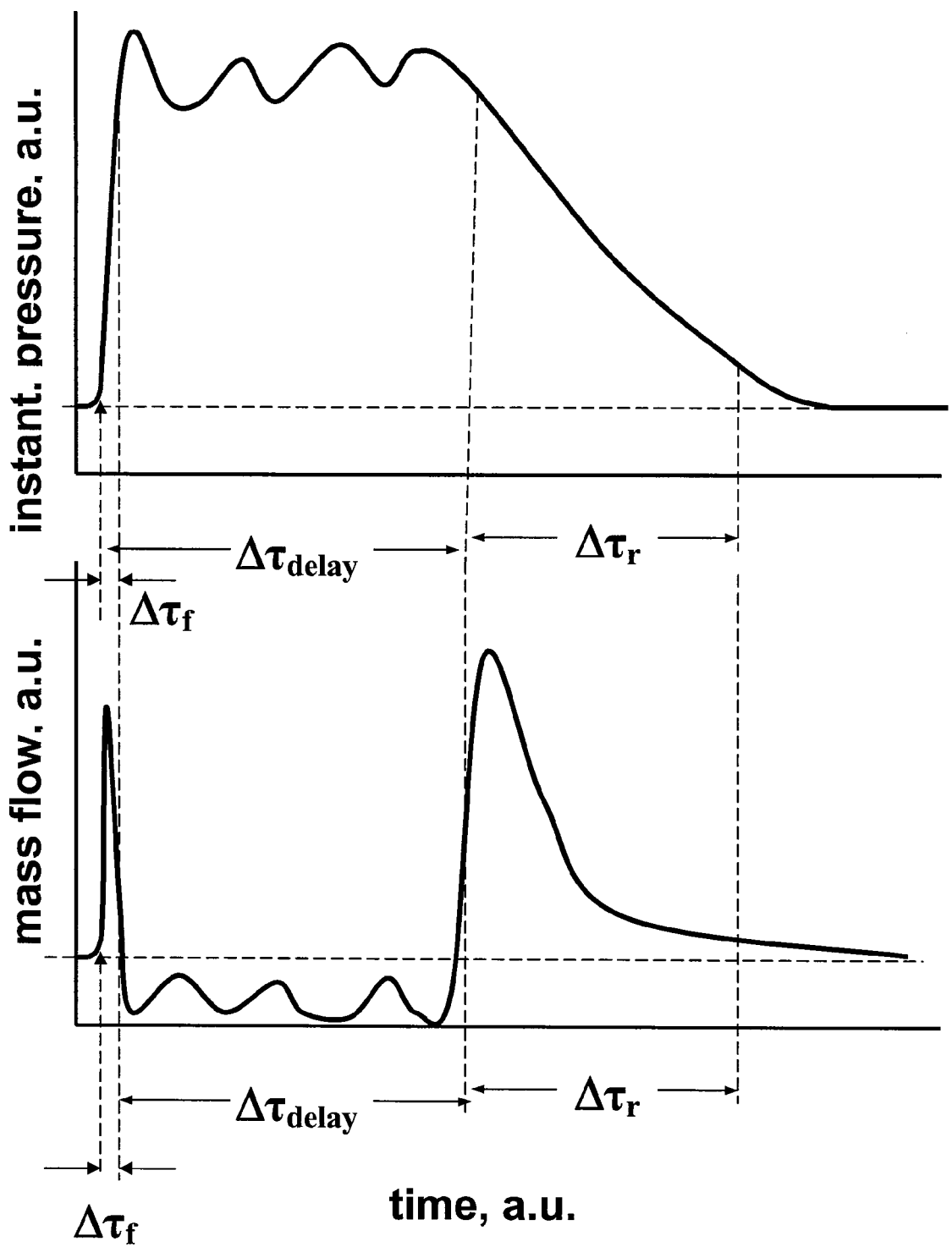
FIG. 2 Plots clarifying an operation of the method and apparatus according to an embodiment.

The variation in time of the instantaneous pressure, the mass flow is additionally illustrated in FIG. 2 where $\Delta T_f$ denotes a time-width of the front of pressure pulse, $\Delta T_{delay}$ denotes a delay time predetermined by a delay circuit, and $\Delta T_r$ denotes a time of pressure release that occur at the last stage of operation circle of the externally controlled valve 10, respectively.

As an increase of the pressure in the internal container leads to an increase in the boiling temperature of the cooling agent, cooling power delivered by the cooling agent to the superconducting member 1 significantly reduces during the pressure pulse when the instantaneous pressure may reach 2 bar to 6 bar. This leads to a fast quench of the entire superconductor, suppressing the influence of "hot spots". Finally this results in shortage of the reaction time of regulation of electrical power.

Figure 3:
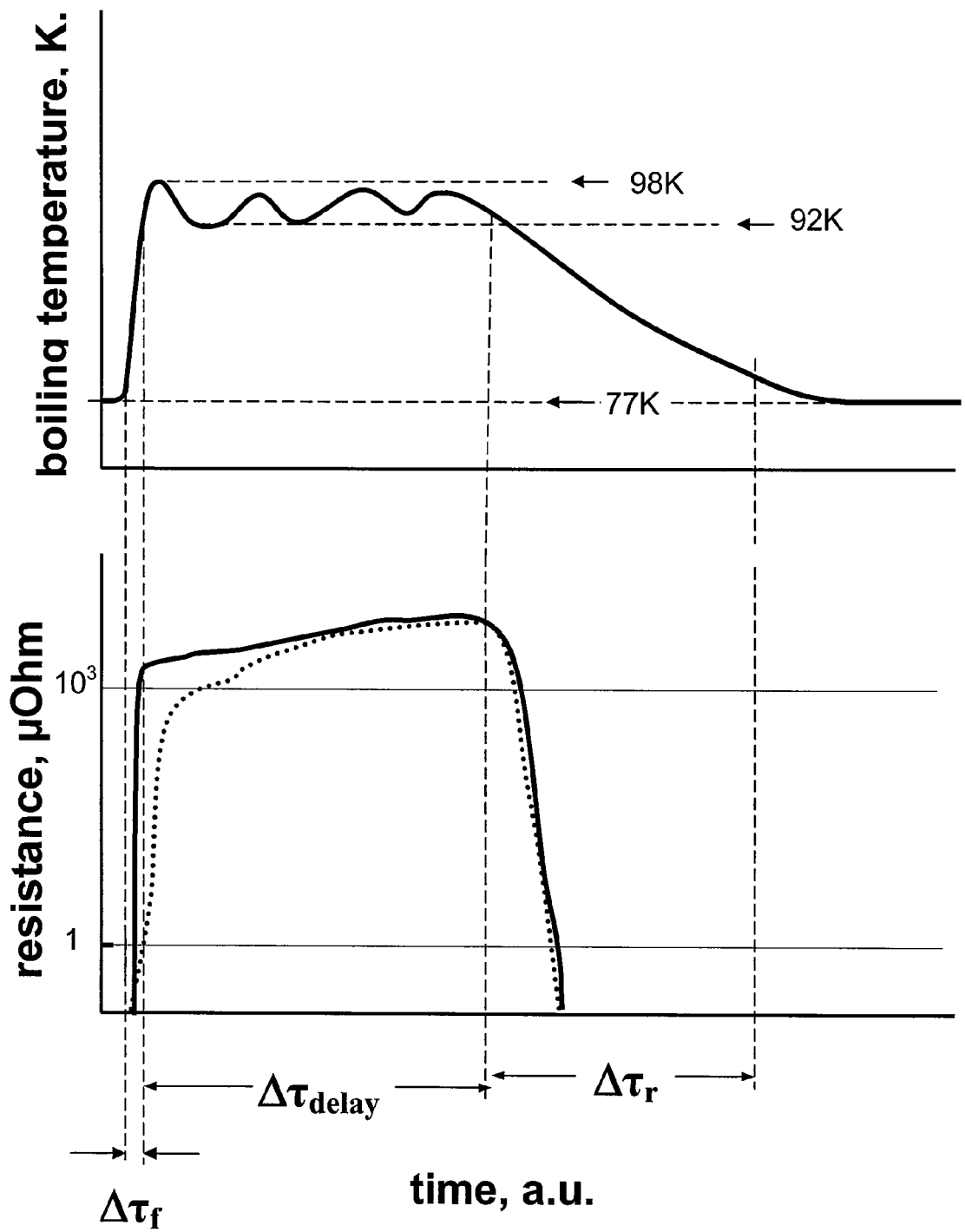
FIG. 3 Further plots clarifying an operation of the method and apparatus according to an embodiment.

The variation with time of the boiling temperature of the cooling agent 6 and the resistance of both the superconducting member 1 and the metallic member 2 electrically jointed in parallel are illustrated by plots depicted in FIG. 3. Denotation in FIG. 3 are the same as in FIG. 2; solid curves correspond to the present invention, a spot curve corresponds to the known state of art. As it follows from FIG. 3, the reaction time which is provided by the present method and apparatus are significantly shorter than those provided by apparatus and methods in which the exchange of the cooling agent is not controlled according to an embodiment: The reaction time is reduced using the method and apparatus by a factor from 5 to 20 leading to absolute values of reaction time of order of 100 µs.

Figure 4:
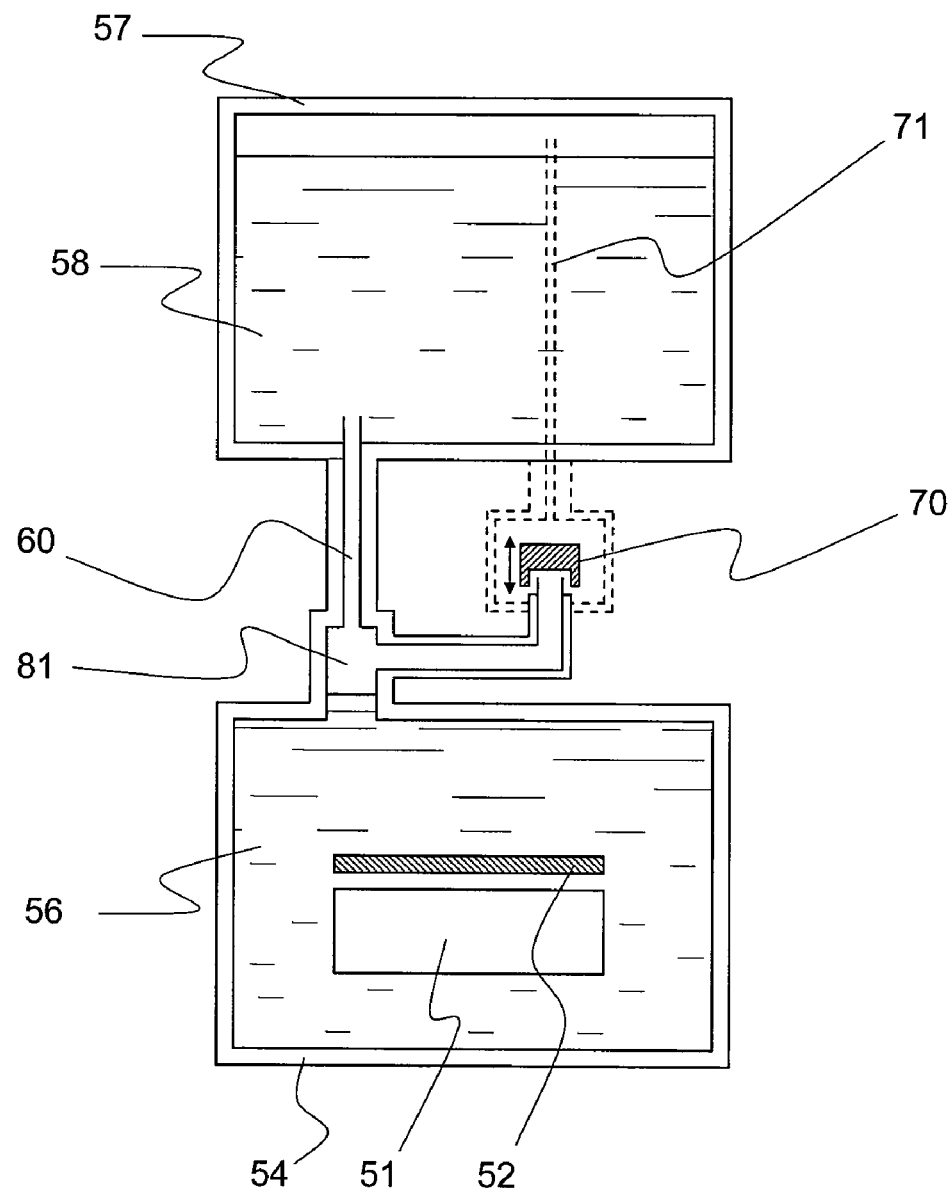
FIG. 4 A schematic view of a second embodiment of the apparatus.

FIG. 4 depicts a schematic view of the second embodiment of the apparatus. The apparatus comprises:
- a superconducting member 51 exhibiting a capability of quenching at the electrical current exceeding a threshold value,
- a metallic member 52 coupled to the superconducting member by a common part of magnetic flux (not shown in the figure),
- a thermally insulated and tight internal container 54 filled with a portion of a liquid fraction 56 of a cooling agent and a portion of a gas fraction 81 of the cooling agent,
- the internal container 54 being capable of providing a cooling of the superconducting member 51 and the metallic member 52 by their direct contact with the liquid fraction 56 of the cooling agent and
- means 60, 70, 71 for providing a mass exchange of the cooling agent between the internal container 4 and an external container 7.

These means for the mass exchange comprise
- a mass flow controller 60, that is based on a transient member 60,
- a controller 70 of an instantaneous pressure in the internal container 54, and
- a delay circuit 60.

In this embodiment, the delay circuit provided by same transient member 60 which comprises the mass flow controller.

The transient member 60 is provided as a nozzle with a sufficiently small cross-section in order to provide a pulse of pressure in the internal container 54 during the time required for power regulation (i.e. power limitation).

The controller of the instantaneous pressure comprises a normally closed additional valve 70, with self return function. The additional valve may also be connected to an upper part of the external container 57, at a position which is above the level of the liquid cooling agent 58.

Operation of the apparatus of FIG. 4 follows the same method as used for apparatus of FIG. 1 with a difference that the nozzle 60 operating as passive element results in a reaction time of around 200 microseconds which is about 2 times longer than the reaction time exhibited by the embodiment of FIG. 1. However, this reaction time is still much shorter than the reaction time displayed by state of the art apparatus and methods.

Figure 5:
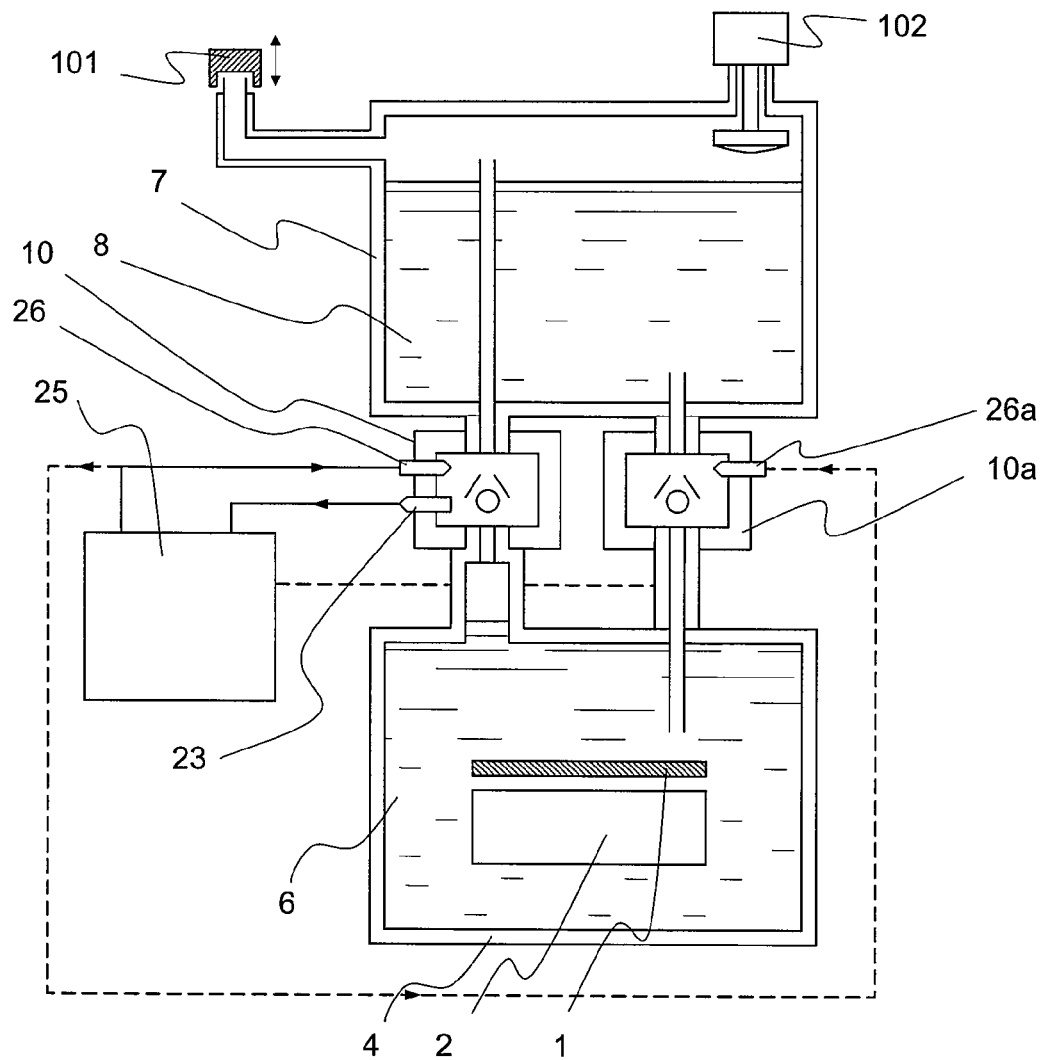
FIG. 5 A schematic view of a third embodiment of the apparatus.

FIG. 5 depicts a schematic view of the third embodiment of the apparatus. The apparatus comprises in this case the same components as the apparatus shown in FIG. 1 with the following modifications:
- a functionality of mass exchange for the liquid cooling agent and for the gas cooling agent is split in such a way that the gas exchange is provided by an externally controlled valve 10 with an actuator 26 while the liquid exchange is provided by a second externally controlled valve 10a equipped with an actuator 26a;
- the apparatus comprises a supplementary valve 101 that provides a regulation of the pressure in the external container 7;
- the apparatus comprises a cooling machine 102 providing a condensation of the gas cooling agent within the external container 7.

A controller (not shown in FIG. 5) of an instantaneous pressure in the internal container 4 is present as a part of the present construction. The apparatus may also comprise the electrical joints 3 between the superconducting member 1 and the metallic member 2, as well as current feedthroughs 5 which are shown in FIG. 1 and not shown in FIG. 5. Alternatively, in case of inductive or magnetic coupling of the superconducting member 1 and of the metallic member 2 such joints and feedthroughs are not required.

The apparatus is operating in the same way as the apparatus of FIG. 1 with a difference that the controlling of mass flow is provided by two channels comprising two independent valves 10 and 10a. The apparatus and the method are capable of more precise controlling of mass flow compared to the embodiment of FIG. 1. A further 30% reduction in the reaction time compared to the embodiment of FIG. 1 can be provided. The reaction time of the apparatus of FIG. 5 was 70 microseconds.

Figure 6:
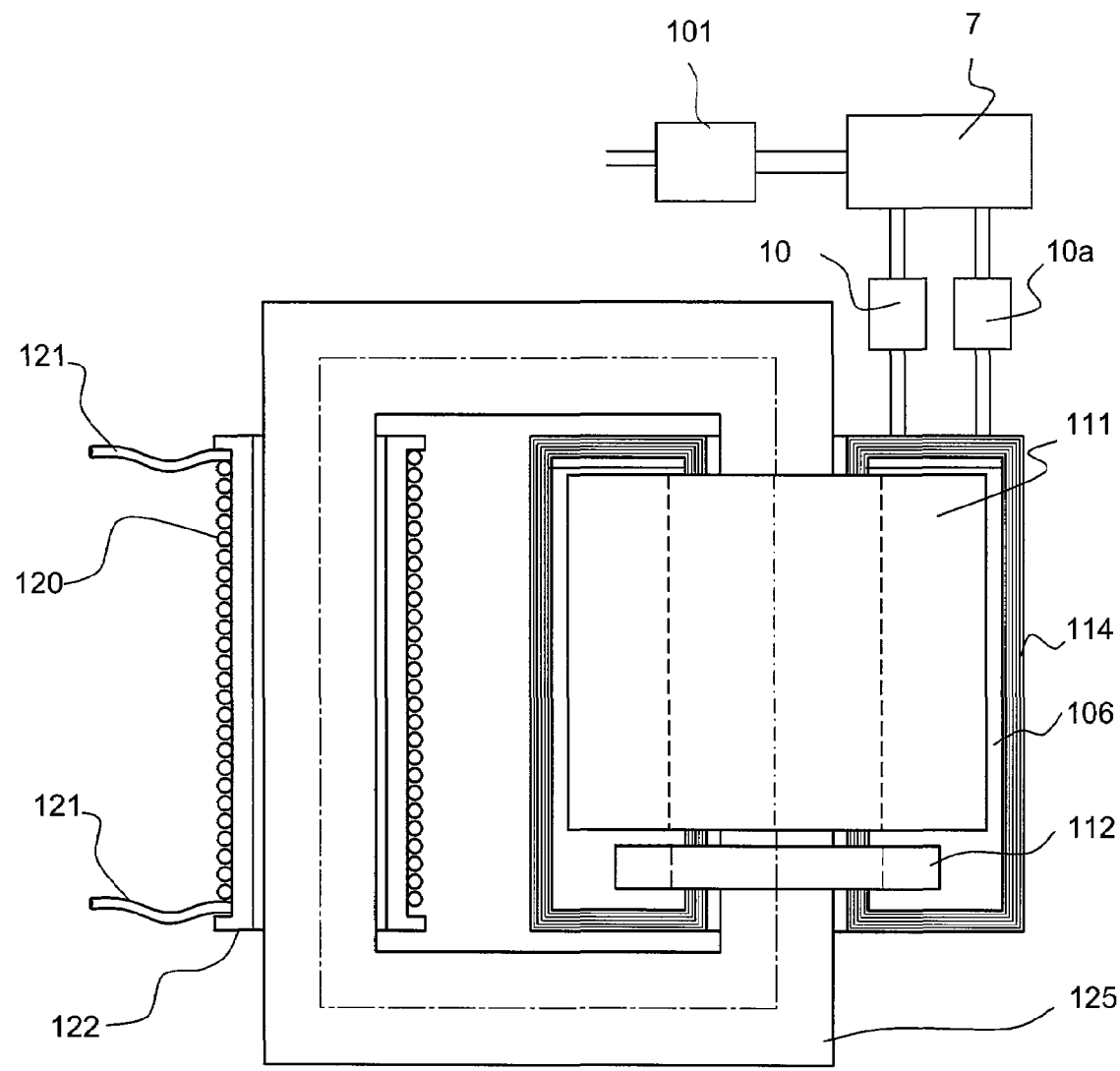
FIG. 6 A schematic view of a fourth embodiment of the apparatus.

FIG. 6 reveals a schematic view of the fourth embodiment of the apparatus. The apparatus comprises the same components as the apparatus shown in FIG. 5 with the following modifications:

the internal container 114, which is filled with a liquid cooling agent in volume 106, is provided with a toroidal shape in order to provide a magnetic coupling of the superconducting member 111 with a primary spool 120 provided on an insulating core 122. The coupling is provided the iron core 125. A metallic member is provided in part as a metallic ring 112 and in part as metallic walls of the internal container 114; both of the metallic ring 112 and the metallic walls of the internal container 114 are coupled with a magnetic flux provided in an iron core 125.

The difference in method of operation compared to the method of FIG. 5 follows mainly from the employed magnetic coupling of the superconducting member 11 so that the current of an ac circuit to be regulated regarding electrical power is delivered to the primary spool 120 through the end wires 121.

What is claimed is:

1. A method for regulation of electrical power comprising the steps of:
   transporting an electrical current through a superconducting member exhibiting a capability of quenching at the electrical current exceeding a threshold value;
   transporting an additional electrical current through a metallic member coupled to the superconducting member;
   filling of a thermally insulated and enclosed internal container with a portion of a liquid fraction of a cooling agent and a portion of a gas fraction of the cooling agent;
   cooling of the superconducting member and the metallic member by their direct contact with the liquid fraction of the cooling agent in the internal container, and
   providing a mass exchange of the cooling agent between the internal container and an external container, wherein the exchange of the cooling agent is controlled
   as a function of both
      a mass flow of the cooling agent which is output from the internal container, and
      an instantaneous pressure in the internal container and
   with an interruption of a predetermined duration.

2. The method according to claim 1, wherein the mass exchange is enabled when the instantaneous pressure in the internal container exceeds the pressure in the external container by a pre-determined value.

3. The method according to claim 1, wherein the mass exchange is substantially reduced after the mass flow that is output from the internal container exceeds a pre-determined level.

4. The method according to claim 1, wherein the mass exchange is enabled after the predetermined time delay after the instantaneous pressure in the internal container reaches higher values compared to the pressure in the external container.

5. An apparatus for regulation of electrical power comprising:
   a superconducting member exhibiting a capability of quenching at the electrical current exceeding a threshold value,
   a metallic member coupled to the superconducting member,
   a thermally insulated and tight internal container filled with a portion of a liquid fraction of a cooling agent and a portion of a gas fraction of the cooling agent,
   the internal container being capable to provide a cooling of the superconducting member and the metallic member by their direct contact with the liquid fraction of the cooling agent, and
   means for providing a mass exchange of the cooling agent between the internal container and an external container, wherein the means for the mass exchange of the cooling agent comprise:
   a mass flow controller for the cooling agent which is output from the inner container;
   a controller of an instantaneous pressure in the internal container, and
   a delay circuit providing a pre-determined time-delay for mass flow controller operation.

6. The apparatus according to claim 5, wherein the mass flow controller comprises a transient member that is capable of transporting of the cooling agent and which provides an increased differential pressure between the internal container and the external container after each event of increased mass flow.

7. The apparatus according to claim 6, wherein the transient member is provided as a nozzle.

8. The apparatus according to claim 6, wherein the transient member is provided as an externally controllable valve.

9. The apparatus according to claim 5, wherein the controller of the instantaneous pressure comprises a further normally closed valve.

10. The apparatus according to claim 5, wherein the delay circuit provides opening of the externally controlled valve.

11. The apparatus according to claim 5, wherein the metallic member is at least partly provided by at least one metallic wall of the internal container.

12. The apparatus according to claim 5, wherein the metallic member is coupled to the superconducting member by electrical joints or through a common part of magnetic flux.

13. The apparatus according to claim 5, wherein the superconducting member comprises coated superconducting tape comprising a high temperature superconductor.

14. An apparatus for regulation of electrical power comprising:
   a superconducting member exhibiting a capability of quenching at the electrical current exceeding a threshold value,
   a metallic member coupled to the superconducting member,
   a thermally insulated and tight internal container filled with a portion of a liquid fraction of a cooling agent and a portion of a gas fraction of the cooling agent,
   the internal container being capable to provide a cooling of the superconducting member and the metallic member by their direct contact with the liquid fraction of the cooling agent, and means for providing a mass exchange of the cooling agent between the internal container and an external container, wherein the means for the mass exchange of the cooling agent comprise:

a mass flow controller for the cooling agent which is output from the inner container;

a controller of an instantaneous pressure in the internal container, and a delay circuit providing a pre-determined time-delay for mass flow controller operation, and wherein the mass flow controller comprises a transient member that is capable of transporting of the cooling agent and which provides an increased differential pressure between the internal container and the external container after each event of increased mass flow.

15. The apparatus according to claim 14, wherein the transient member is provided as a nozzle.

16. The apparatus according to claim 14, wherein the transient member is provided as an externally controllable valve.

17. The apparatus according to claim 14, wherein the controller of the instantaneous pressure comprises a further normally closed valve.

18. The apparatus according to claim 14, wherein the delay circuit provides opening of the externally controlled valve.

19. The apparatus according to claim 14, wherein the metallic member is at least partly provided by at least one metallic wall of the internal container.

20. The apparatus according to claim 14, wherein the metallic member is coupled to the superconducting member by electrical joints or through a common part of magnetic flux.

* * * * *